(12) United States Patent
Kubo

(10) Patent No.: US 6,309,961 B1
(45) Date of Patent: Oct. 30, 2001

(54) METHOD OF FORMING DAMASCENE WIRING IN A SEMICONDUCTOR DEVICE

(75) Inventor: Akira Kubo, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/433,291

(22) Filed: Nov. 3, 1999

(30) Foreign Application Priority Data

Nov. 4, 1998 (JP) .................................................. 10-313324

(51) Int. Cl.⁷ ................................................. H01L 21/4763
(52) U.S. Cl. .......................... 438/633; 438/637; 438/638; 438/645; 438/668; 438/672; 438/685; 438/687; 438/688; 438/692; 438/700
(58) Field of Search .................... 438/633, 637, 438/638, 645, 668, 672, 685, 687, 688, 692, 700

(56) References Cited

U.S. PATENT DOCUMENTS

| | | | |
|---|---|---|---|
| 5,602,423 | * 2/1997 | Jain ...................................... | 257/752 |
| 5,721,172 | * 2/1998 | Jang et al. ............................ | 438/633 |
| 6,017,803 | * 1/2000 | Wong .................................... | 438/692 |
| 6,051,496 | * 4/2000 | Jang ....................................... | 438/633 |
| 6,069,082 | * 5/2000 | Wong et al. .......................... | 438/692 |
| 6,093,656 | * 7/2000 | Lin ......................................... | 438/633 |
| 6,103,625 | * 8/2000 | Marcyk et al. ....................... | 438/692 |
| 6,107,187 | * 8/2000 | Lao et al. .............................. | 438/633 |
| 6,114,243 | * 1/2000 | Gupta et al. .......................... | 438/687 |

FOREIGN PATENT DOCUMENTS

| | | |
|---|---|---|
| 7-45616 | 2/1995 | (JP) . |
| 8-288385 | 11/1996 | (JP) . |
| 9-8039 | 1/1997 | (JP) . |
| 9-167768 | 6/1997 | (JP) . |
| 9-270465 | 10/1997 | (JP) . |

OTHER PUBLICATIONS

Japanese Office Action dated Nov. 7, 2000, with partial English translation.

* cited by examiner

Primary Examiner—Charles Bowers
Assistant Examiner—Lynne A. Gurley
(74) Attorney, Agent, or Firm—McGinn & Gibb, PLLC

(57) ABSTRACT

A method of polishing a metal film which is used for forming damascene wirings or conductors by polishing a metal film formed on an insulating film having trenches thereon by using a CMP, in which excess polishing, that is, dishing, of buried conductors having large area occurring when the metal film is polished by the CMP method can be restrained. The method comprises: providing a substrate on which an insulating film is formed; forming a trench in the insulating film; forming a buried metal film portion in the trench whose width is equal to or larger than 1 micrometer; forming a first metal film on the insulating film such that the buried metal film portion is covered by the first metal film; and polishing a surface of the first metal film by using a CMP method. A lower portion of the buried metal film portion is buried in the trench whose width is equal to or larger than 1 micrometer, and at least a part of an upper portion of the buried metal film portion is located higher than the top surface of the insulating film.

27 Claims, 5 Drawing Sheets

PRIOR ART

PRIOR ART

METHOD OF FORMING DAMASCENE WIRING IN A SEMICONDUCTOR DEVICE

FIELD OF THE INVENTION

The present invention relates generally to a method of polishing a metal film which is used for forming damascene wirings or conductors by polishing a metal film formed on an insulating film having trenches thereon by using a CMP (Chemical Mechanical Polishing) method. More particularly, the present invention relates to a method of polishing a metal film in which excess polishing, that is, dishing, of buried conductors having large area occurring when the metal film is polished by the CMP method can be restrained.

BACKGROUND OF THE INVENTION

Recently, in a manufacturing process of a semiconductor device, damascene wirings or buried wirings are often fabricated by forming a metal film on an insulating film having trenches thereon such that the trenches are filled with the material of the metal film and by polishing the metal film by using the CMP method.

FIG. 4A through FIG. 4C are schematic cross sectional views illustrating a conventional method of polishing a metal film to form such a damascene wiring.

In this method, as shown in FIG. 4A, a groove or a trench 33 is formed in an insulating film 32, such as an oxide film and the like, formed on a semiconductor substrate 31 by using photolithography and etching, and the like. In the drawings, only one trench is shown for the sake of simplicity. However, in practice, it is possible to form many trenches and, therefore, many damascene wirings simultaneously. Then, as shown in FIG. 4B, a metal film 36 is formed on the insulating film 32 such that the trench 33 is filled with the material of the metal film 36. Thereafter, as shown in FIG. 4C, the metal film 36 is polished by the CMP method until the insulating film 32 is exposed. Thereby, a buried wiring, that is, the damascene wiring 37, which comprises a portion of the metal film 36 remaining in the trench 33 is formed.

However, in the above-mentioned conventional method, as the width of the trench 33 becomes large, the portion of the metal film 36 buried in the trench 33 is overpolished in the vicinity of the central portion of the trench 33. Thereby, as shown in FIG. 4C, a recessed portion is produced on the upper surface of the damascene wiring 37.

Japanese patent laid-open publication No. 9-8039 discloses a method of forming a buried wiring which can improve the disadvantage of the above-mentioned conventional method of forming a damascene wiring.

FIG. 5A through FIG. 5C illustrate a method of forming a buried wiring disclosed in Japanese patent laid-open publication No. 9-8039. First, as shown in FIG. 5A, trenches 43 are formed in an insulating film 42 formed on a semiconductor substrate 41 by using photolithography and etching. In this case, island patterns 44 comprising portions of the insulating film 42 are left in the trenches 43.

Then, as shown in FIG. 5B, a metal film 45 is formed on the insulating film 42 such that the trenches 43 are filled by the material of the metal film 45. Thereafter, as shown in FIG. 5C, the metal film 45 is polished by the CMP method until the insulating film 42 is exposed. Thereby, a buried wiring, that is, a damascene wiring, 46 is formed in each of the trenches 43. By using this method, since the island patterns 44 exist in each of the trenches 43, it is possible to avoid overpolishing, that is, dishing, which occurs when a buried wiring pattern having large area is formed.

However, in the method disclosed in Japanese patent laid-open publication No. 9-8039 and described above, the volume of each buried wiring 46 decreases by the amount of the volume of the island patterns 44. Therefore, it is impossible to obtain good electrical characteristic, such as electrical resistance and the like, of the buried wiring 46. Also, because of the existence of the island patterns 44, there is a possibility that the electrical characteristic becomes even worse. Further, when the buried wiring 46 is to be coupled, for example, to any other conductor portion by using a via hole and the like, it is necessary to consider locations and sizes of the island patterns 44. Therefore, design of connection in a semiconductor device becomes complicated. These disadvantages are caused by forming the island patterns 44 in each of the trenches 43.

SUMMARY OF THE INVENTION

Therefore, it is an object of the present invention to obviate the disadvantages of the above-mentioned prior art.

It is another object of the present invention to provide a method of polishing a metal film in which excess polishing, that is, dishing, of buried conductors having large area occurring when the metal film is polished by the CMP method can be restrained, thereby providing damascene wirings or conductors each having planar top surface.

It is still another object of the present invention to provide a method of polishing a metal film in which excess polishing, that is, dishing, of buried conductors having large area occurring when the metal film is polished by the CMP method can be restrained without forming island patterns in each trench, thereby providing damascene wirings or conductors having large cross sections and high reliability.

According to an aspect of the present invention, there is provided a method of polishing a metal film used for forming a damascene wiring, the method comprises: providing a substrate on which an insulating film is formed; forming a trench in the insulating film; forming a buried metal film portion in the trench whose width is equal to or larger than 1 micrometer; forming a first metal film on the insulating film such that the buried metal film portion is covered by the first metal film; and polishing a surface of the first metal film by using a CMP method.

In this case, it is preferable that a lower portion of the buried metal film portion is buried in the trench whose width is equal to or larger than 1 micrometer, and at least a part of an upper portion of the buried metal film portion is located higher than the top surface of the insulating film.

It is also preferable that, in the polishing the surface of the first metal film by using the CMP method, the first metal film and the buried metal film portion are polished.

It is advantageous that each of the buried metal film portion and the first metal film includes an alloy including at least one metal selected from a group consisting of tungsten, aluminum, copper and titanium.

It is also advantageous that the forming a buried metal film portion in the trench whose width is equal to or larger than 1 micrometer comprises: forming a second metal film on the insulating film such that the trench is filled with the material of the second metal film; and selectively removing the second metal film, and forming the buried metal film portion comprising a portion of the second metal film remaining in the trench whose width is equal to or larger than 1 micrometer.

Also, it is preferable that, in the selectively removing the second metal film, and forming the buried metal film portion comprising a portion of the second metal film remaining in the trench whose width is equal to or larger than 1 micrometer, a portion of the second metal film in the trench whose width is equal to or larger than 1 micrometer is left and another portion of the second metal film is removed.

It is possible to form the first and second metal films by a reflow sputtering method.

It is also possible to form the first and second metal films by a CVD method.

Further, it is possible to form the first and second metal films by a plating method.

It is preferable that the forming a buried metal film portion in the trench whose width is equal to or larger than 1 micrometer comprises: forming a second metal film on the insulating film such that the trench is filled with the material of the second metal film; forming a resist film on the second metal film; patterning the resist film to form patterned resist film which covers the second metal film on the trench whose width is equal to or larger than 1 micrometer; by using the patterned resist film as an etching mask, leaving the second metal film on the trench whose width is equal to or larger than 1 micrometer, and removing other portions of the second metal film by etching; and removing the resist film remaining.

According to another aspect of the present invention, there is provided a method of polishing a metal film used for forming a damascene wiring, the method comprises: providing a substrate on which an insulating film is formed; forming trenches in the insulating film; forming a first buried metal film portion in the trench whose width is equal to or larger than 1 micrometer, wherein a lower portion of the first buried metal film portion is buried in the trench, and an upper portion of the first buried metal film portion is located higher than the top surface of the insulating film; and polishing a surface of the first buried metal film portion by using a CMP method.

In this case, it is preferable that the first buried metal film portion includes an alloy including at least one metal selected from a group consisting of tungsten, aluminum, copper and titanium.

Also, it is preferable that, in the forming a first buried metal film portion in the trench whose width is equal to or larger than 1 micrometer, the first buried metal film portion is formed only in the trench whose width is equal to or larger than 1 micrometer.

It is advantageous that the forming a first buried metal film portion in the trench whose width is equal to or larger than 1 micrometer comprises: forming a metal film on the insulating film such that the trench is filled with material of the metal film; forming a resist film on the metal film; patterning the resist film to form a patterned resist film which covers the metal film on the trench whose width is equal to or larger than 1 micrometer; by using the patterned resist film as an etching mask, etching the metal film; and removing the resist film remaining, wherein the first buried metal film portion comprises a portion of the metal film remaining in the trench whose width is equal to or larger than 1 micrometer.

It is preferable that, in etching the metal film by using the patterned resist film as an etching mask, a portion of the metal film in the trench whose width is equal to or larger than 1 micrometer is left, a top surface of the insulating film in an area in which a trench is not formed is exposed, and a second buried metal film portion comprising a portion of the metal film in the trench whose width is smaller than 1 micrometer is left, and wherein the top surface of the second buried metal film portion has a height approximately corresponding to that of the top surface of the insulating film.

It is possible to form the metal film by using a reflow sputtering method.

It is also possible to form the metal film by using a CVD method.

It is further possible to form the metal film by using a plating method.

It is preferable that the insulating film has portions having different heights, and wherein, in the forming a first buried metal film portion in the trench whose width is equal to or larger than 1 micrometer, forming the first buried metal film portion in the trench whose width is equal to or larger than approximately 1 micrometer and which exists in an area of an insulating film at the higher height portion of the insulating film; and, in the polishing a surface of the first buried metal film portion by using a CMP method, a portion of the first buried metal film portion formed in an area of an insulating film at the higher height portion of the insulating film is polished by the CMP method.

It is also preferable that, in the polishing a surface of the first buried metal film portion by using a CMP method, portion of the first buried metal film portion formed in an area of an insulating film at the higher height portion of the insulating film is polished by using a hard pad.

In the present invention, a material for a metal film and a method of forming the metal film are not limited to those particularly shown in this specification and attached drawings, and any kind of material and method can be used. However, it is preferable to use Al (aluminum) alloy whose film can be formed by using a reflow sputtering method that has good burying characteristic, or to use an alloy of W (tungsten) system or an alloy of Cu (copper) system whose film can be formed by using a CVD (Chemical Vapor Deposition) method or a plating method. Also, there is no limitation on a pad and an abrasive. However, as a pad, it is possible to preferably use, for example, a hard pad such as IC1000 type pad and the like, or a laminated pad composed of such hard pad and SUBA IV (SUBA400, in Japan) type pad and the like. The IC1000 and the SUBA IV or SUBA400 are products names of RODEL, Inc., U.S.A. As an abrasive, it is possible to preferably use, for example, an abrasive whose abrasive grains are alumina or silica.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which.

DESCRIPTION OF A PREFERRED EMBODIMENT

With reference to the drawings, embodiments of the present invention will now be described.

Figure 1A:
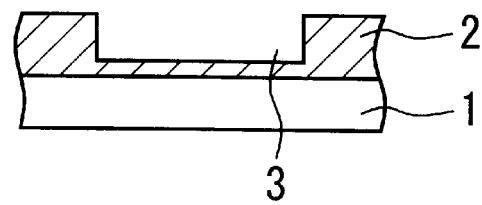
FIG. 1A through FIG. 1E are schematic partial cross sectional views illustrating cross sectional structures at various stages during a process of polishing a metal film according to a first embodiment of the present invention.

FIG. 1A through FIG. 1E are schematic partial cross sectional views illustrating cross sectional structures at various stages during a process of polishing a metal film according to a first embodiment of the present invention. As shown in FIG. 1A, on a semiconductor substrate 1, an insulating film such as a plasma CVD oxide film (a plasma oxide film) 2 is formed. It is also possible to form any other layer, a circuit structure, and the like, for example, between the semiconductor substrate 1 and the plasma oxide film 2. Then, a groove or a trench 3 is formed on the plasma oxide film 2 by using a photolithography and a RIE (Reactive Ion Etching) method, and the like. In the drawings, only one trench is shown for the sake of simplicity. However, in practice, it is possible to form many trenches and, therefore, many damascene wirings simultaneously.

Figure 1B:
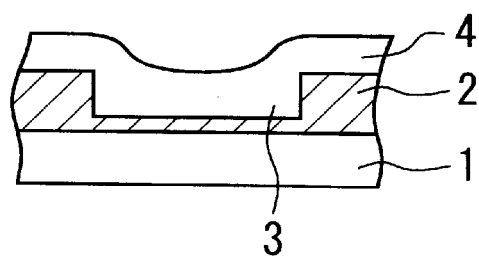

Then, as shown in FIG. 1B, a metal film 4 is formed on the plasma oxide film 2 by using a reflow sputtering method and the like such that the trench 3 is filled with the material of the metal film 4. The metal film 4 has, for example, a double layer structure comprising a Ti film approximately 100 angstroms thick and an AlCu film approximately 8000 angstroms thick formed on the Ti film. Thus, in this case, the metal film 4 is an AlCu/Ti film.

Thereafter, on the metal film 4, a photo resist film not shown in the drawing is formed, and is patterned by using well known process of exposure and the like. By using the patterned photo resist film as an etching mask, the metal film 4 is selectively removed by using, for example, dry etching process. Thereby, only a portion of the metal film 4 which is formed in the trench 3 having a width equal to or larger than approximately 1 μm (micrometer) is left, and other portions of the metal film 4 are removed. Although not shown in the drawing, if there are trenches each having a width smaller than approximately 1 micrometer in the oxide film 2, portions of the metal film 4 buried in such trenches are also removed. Thereafter, the photo resist film is removed.

Figure 1C:
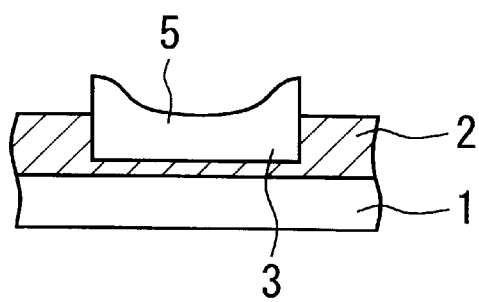

By these processes, as shown in FIG. 1C, a metal film portions 5 is formed only in the trench 3 whose width is equal to or larger than approximately 1 micrometer, among the trenches (not shown in the drawing) provided in the plasma oxide film 2. The metal film portion 5 is constituted of a remaining portion of the metal film 4. A lower portion of the metal film portion 5 is buried within the trench 3 and an upper portion thereof projects at least partially from the trench 3.

As shown in FIG. ID, a metal film 6 is again deposited on the whole area of the semiconductor substrate 1 by using a reflow sputtering method and the like. The metal film 6 has, for example, a two layer structure comprising a Ti film approximately 100 angstroms thick and an AlCu film approximately 5000 angstroms thick. Thus, in this case, the metal film 6 is an AlCu/Ti film.

Lastly, the metal film 6 and the metal film portion 5 are polished by using the CMP method to planarize the top surface thereof and to expose the oxide film 2. Thereby, as shown in FIG. 1E, a buried wiring 7 which is a damascene wiring is formed. In this case, as a pad used in the CMP method, it is possible to preferably use, for example, a laminated pad comprising a hard pad, such as IC1000 type pad, and SUBA IV (or SUBA400 type, in Japan) type pad. As an abrasive, it is possible to preferably use, for example, an abrasive whose abrasive grains are alumina or silica. The IC1000 and the SUBA IV (SUBA400) are products names of RODEL, Inc., U.S.A.

According to this embodiment, it is possible to restrain overpolishing, that is, dishing, of the damascene wiring having large width or the buried conductor pattern having large area. Thereby, it is possible to improve characteristics and reliability of buried wirings and conductors.

Figure 2:
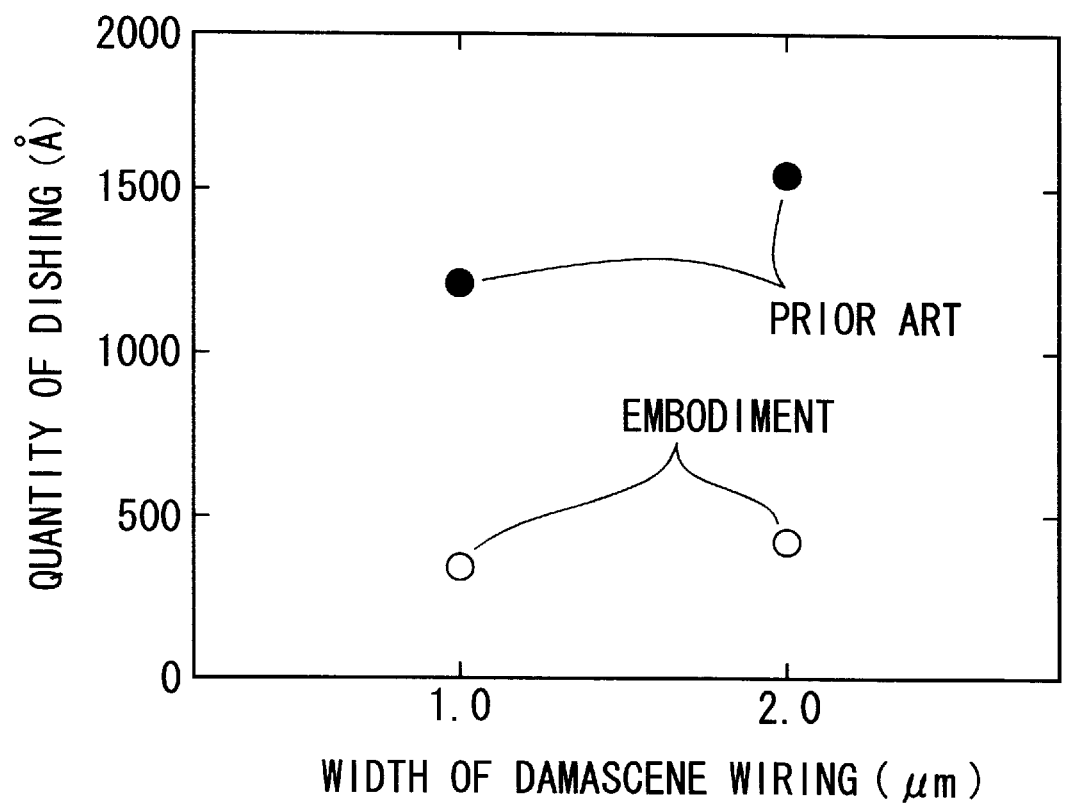
FIG. 2 is a graph showing relations between width of damascene wiring and quantity of dishing in the method according to the prior art and in the method according to an embodiment of the present invention.

FIG. 2 is a graph showing relations between width of damascene wiring and quantity of dishing in the method according to the prior art and in the method according to the embodiment of the present invention. In FIG. 2, an abscissa corresponds to a width of a trench, that is, a width of a damascene wiring to be formed in micrometers. An ordinate corresponds to a depth of recessed portion of a damascene wiring formed, that is, a quantity of dishing in angstroms. The prior art method in the graph of FIG. 2 corresponds to the method described with reference to FIGS. 4A through 4C, and, in the prior art method, island patterns shown in FIGS. 5A through 5C are not formed in each trench.

Figure 4A:
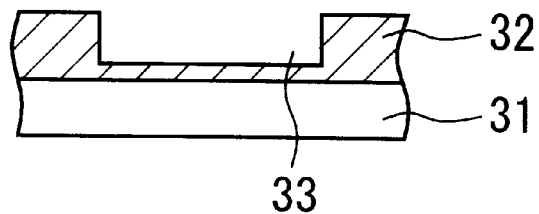
FIG. 4A through FIG. 4C are schematic partial cross sectional views illustrating cross sectional structures at various stages during a process of polishing a metal film according to a prior art method.
Figure 4B:
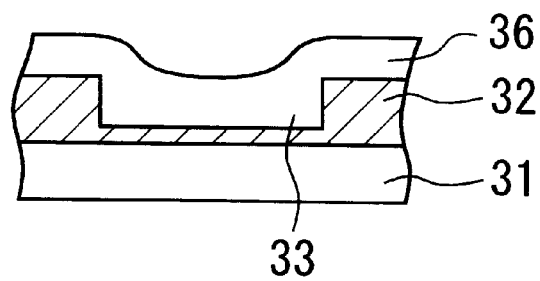
Figure 4C:
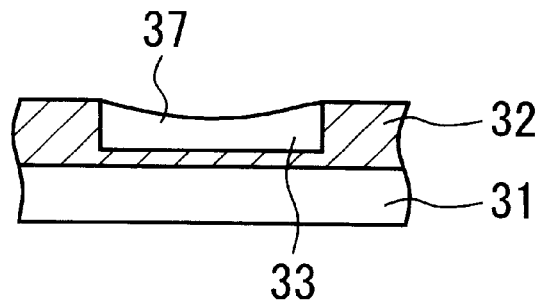
Figure 5A:
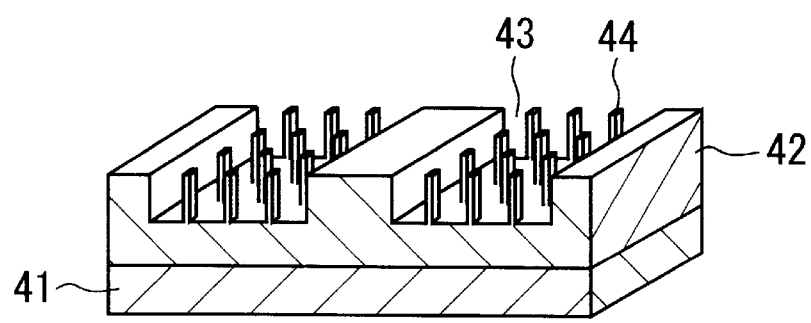
FIG. 5A through FIG. 5C are schematic partial perspective views illustrating device structures at various stages during a process of forming buried wirings according to another prior art method.
Figure 5B:
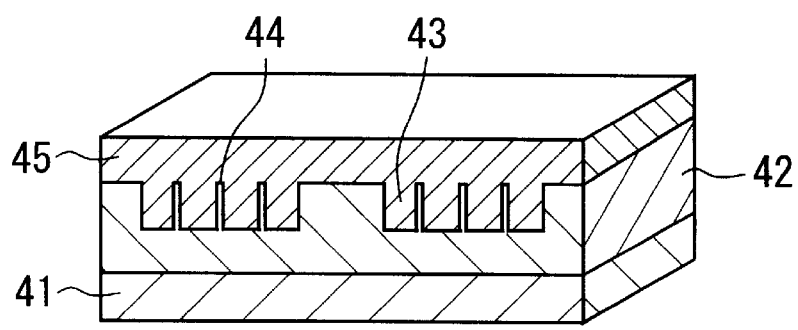
Figure 5C:
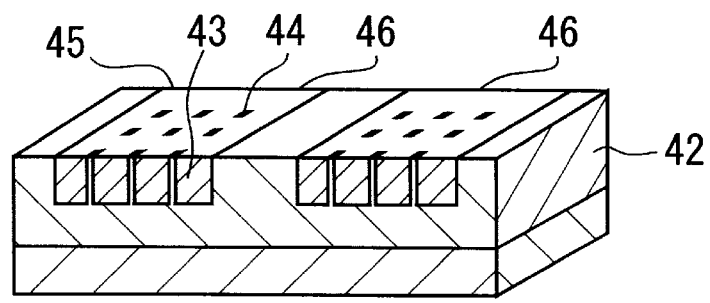

As seen from FIG. 2, when compared with the prior art method shown in FIGS. 4A through 4C in which the CMP is performed after forming the metal film by sputtering, in the method according to the present invention, the quantity of dishing of the damascene wiring having relatively large width is reduced to a quantity equal to or smaller than ¼ through ⅓ of the prior art method. This is because, in the present invention, only the portion of the trench 3 having a width equal to or larger than approximately 1 micrometer is filled with the metal film portion 5, and thereafter the metal film 6 is formed on whole area of the substrate 1. Thereby, thickness of the metal film is made large on the trench 3 having large width.

Figure 1D:
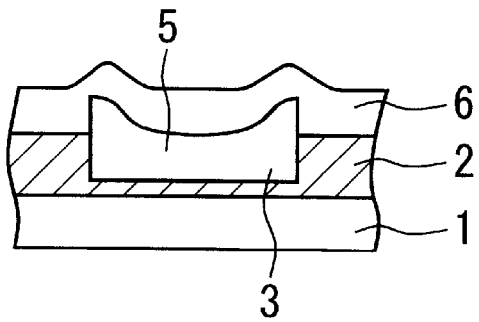
Figure 1E:
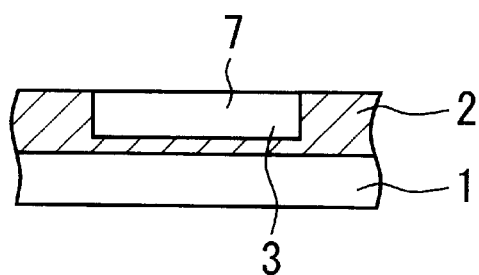

The total thickness of the metal film in the proximity of the central portion of the trench 3 just before performing the CMP shown in FIG. 1D, that is, the sum of the thickness of the metal film portion 5 and the thickness of the metal film 6, is thicker than the overall thickness of the metal film in the proximity of the central portion of the trench 33 just before performing the CMP in the prior art method shown in FIG. 4B, that is, the thickness of the metal film 36, by the thickness of the metal film portion 5. Therefore, in the present embodiment, only the thickness of the metal film portion on the wide trench which is liable to cause dishing is made thicker than that of the prior art, and in this condition the CMP is performed. Therefore, the quantity of dishing can be greatly reduced, and it is possible to form the damascene wiring having a flat top surface.

In the prior art method, if, in the condition the metal film 36 is formed as shown in FIG. 4B, the height of the top surface of the metal film 36 in the proximity of the central portion of the trench 33 is lower than the top surface of the insulating film 32, it is impossible to form a damascene wiring having a flat top surface. Therefore, it is necessary to precisely control the film thickness when forming the metal film 36. On the other hand, in the embodiment of the present invention, the metal film 6 is formed after the trench 3 is filled with the metal film portion 5. Therefore, the height of the top surface of the metal film 6 in the proximity of the central portion of the trench 3 can be easily made higher than the top surface of the insulating film 32, and a damascene wiring having a flat top surface can be easily fabricated.

Further, in the present embodiment, it is not necessary to form island patterns of insulators within each trench as shown in the method of FIGS. 5A through 5C. Therefore, when compared with the prior art method, in the method according to the present embodiment, it is possible to increase a cross sectional area of each damascene wiring and improve electric characteristics and reliability thereof.

When the width of each trench is smaller than approximately 1 micrometer, quantity of dishing is relatively small even if the metal film portion 5 is not provided in the trench. Therefore, in this embodiment, it is preferable to provide the metal film portion 5 only in each trench having a width equal to or larger than approximately 1 micrometer which is liable to cause dishing.

Figure 3A:
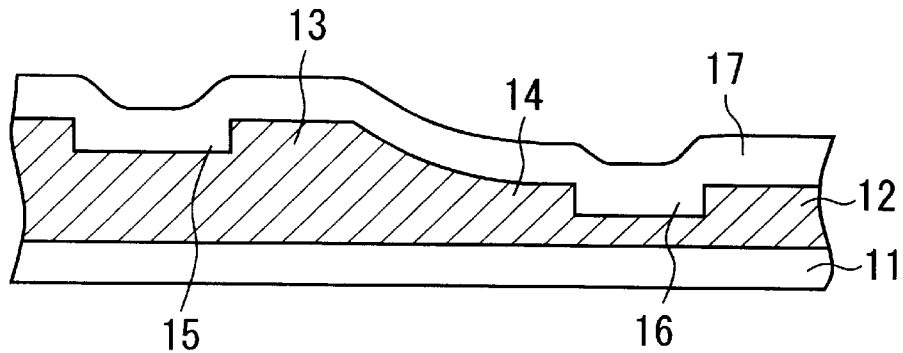
FIG. 3A through FIG. 3C are schematic partial cross sectional views illustrating cross sectional structures at various stages during a process of polishing a metal film according to a second embodiment of the present invention.
Figure 3B:
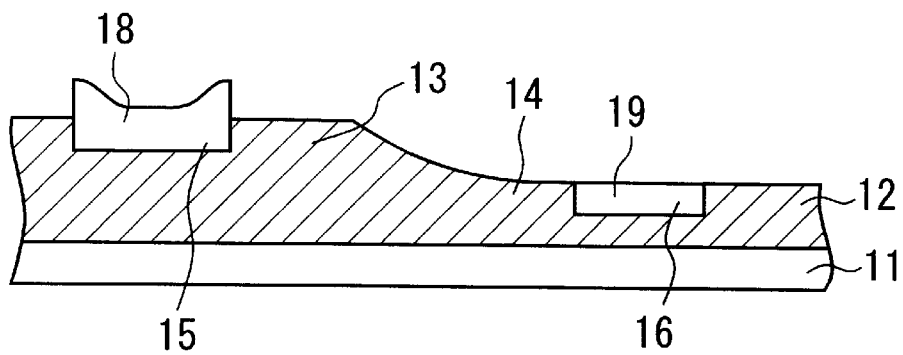
Figure 3C:
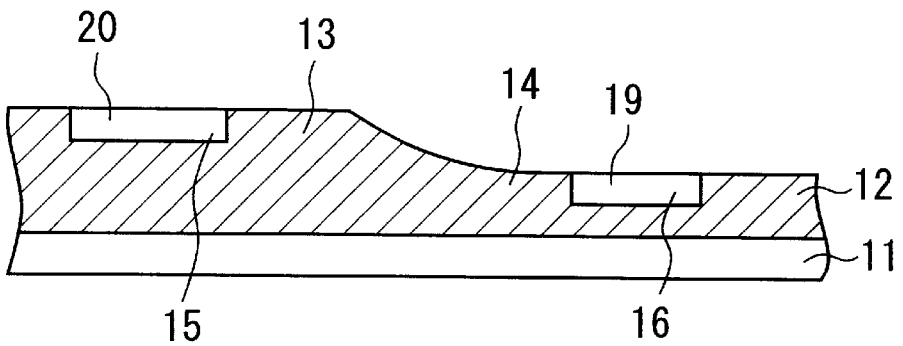

FIGS. 3A through 3C are schematic partial cross sectional views illustrating cross sectional structures at various stages during a process of polishing a metal film according to a second embodiment of the present invention. This embodiment is effective in a device having a difference of height, for example, between a memory cell portion and a peripheral portion. This method uses a combination of the dry etching method and the CMP method in a manner similar to the method of the first embodiment.

As shown in FIG. 3A, on a semiconductor substrate 11, an insulating film, for example, a plasma oxide film 12 having portions of different heights, that is, having a difference of height on the top surface thereof is formed. It is also possible to form any other layer, a circuit structure, and the like, for example, between the semiconductor substrate 11 and the plasma oxide film 12. Also, a trench 15 and a trench 16 are formed on a higher height portion, that is, a projected portion 13 of the plasma oxide film 12 corresponding, for example, a memory cell portion of a semiconductor device and on a lower height portion 14 corresponding, for example, to a peripheral portion of the semiconductor device, respectively, by using a photolithography and an RIE (Reactive Ion Etching) method.

Then, a metal film 17 is formed on the plasma oxide film 12 such that the trench 15 and the trench 16 are filled with the material of the metal film 17, by using a reflow sputtering method and the like. The metal film 17 has, for example, a two layer structure comprising a Ti film approximately 100 angstroms thick and an AlCu film approximately 8000 angstroms thick formed on the Ti film. Thus, the metal film 17 is an AlCu/Ti film. Thereafter, on the metal film 17, a photo resist film not shown in the drawing is formed, and is patterned by using well known process of exposure and the like. By using the patterned photo resist film as an etching mask, the metal film 17 is selectively removed by using, for example, dry etching process. Thereby, as shown in FIG. 3B, a portion of the metal film 17 which is formed in the trench 15, in the projected oxide film portion 13, having a width equal to or larger than approximately 1 μm (micrometer) is left. In this case, the metal film portion 17 on the trench 16 of the lower height portion 14 is planarized by the dry etching process, and a metal film portion 19, that is, a buried wiring is formed.

By these processes, as shown in FIG. 3B, a metal film portion 18 is formed only in the trench 15 whose width is equal to or larger than approximately 1 micrometer, among the trenches (not shown in the drawing) provided in the plasma oxide film 12. The metal film portion 18 is constituted of a remaining portion of the metal film 17. A lower portion of the metal film portion 18 is buried within the trench 15 and an upper portion thereof projects from the trench 15.

Lastly, the metal film portion 18 buried in the trench 15 is polished by using the CMP method to planarize the top surface thereof. When the metal film portion 18 is polished by the CMP method, only the projected oxide film portion 13 and preferably only the metal film portion 18 is polished. In this case, a low polishing load equal to or lower than 5.0 psi is used such that the plasma oxide film 12 and the metal film portion 19 at the lower height portion 14 are not polished. In this embodiment, since the projected oxide film portion 13 and the metal film portion 18, and preferably only the metal film portion 18, is polished, it is preferable to use, as a polishing pad, a hard pad, such as IC1000 type pad. Thereby, as shown in FIG. 3C, buried wiring 20 which is a damascene wiring is formed.

As mentioned above, according to the present invention, it is possible to avoid excess polishing, that is, dishing, of buried conductors having large area occurring when the metal film is polished by the CMP method, thereby providing damascene wirings or conductors each having planar top surface, and high reliability. Also, according to the present invention, it is not necessary to form island patterns in each trench when forming damascene wirings and, therefore, damascene wirings or conductors having good electrical characteristics and high reliability can be formed.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. For example, the damascene wiring in the present invention includes a conductor pattern having large area, such as a pad and the like. Therefore, it is intended that this invention encompasses all of the variations and modifications as fall within the scope of the appended claims.

What is claimed is:

1. A method of forming damascene wiring in a semiconductor device, said method comprising:

providing a substrate on which an insulating film is formed;

forming a large trench having a width equal to or larger than 1 micrometer in said insulating film;

depositing a metal on said insulating film and in said trench;

selectively removing said metal to expose a surface of said insulating film and form a first metal film having a lower portion which fills said trench and an upper portion projecting at least partially out of said trench, said upper portion having sidewalls which are substantially coplanar with sidewalls of said trench;

forming a second metal film on said insulating film such that said first metal film is covered by said second metal film; and polishing a surface of said semiconductor device using a chemical mechanical polishing (CMP) method.

2. The method as set forth in claim 1, wherein at least a part of said upper portion of said first metal film is located higher than a highest surface of said insulating film.

3. The method as set forth in claim 2, wherein said polishing said surface of said semiconductor device comprises polishing said first metal film and said second metal film.

4. The method as set forth in claim 1, wherein each of said second metal film and said first metal film includes an alloy including at least one metal selected from a group consisting of tungsten, aluminum, copper and titanium.

5. The method as set forth in claim 1, wherein said selectively removing said metal comprises leaving a portion of said metal in said trench and removing other portions of said metal.

6. The method as set forth in claim 1, wherein said first and second metal films are formed by a reflow sputtering method.

7. The method as set forth in claim 1, wherein said first and second metal films are formed by a chemical vapor deposition (CVD) method.

8. The method as set forth in claim 1, wherein said first and second metal films are formed by a plating method.

9. The method as set forth in claim 1, wherein said selectively removing said metal comprises:
selectively etching said semiconductor device using a patterned resist film as an etching mask, so that said first metal film in said trench is left and other portions of said first metal film are removed.

10. The method as set forth in claim 1, wherein, after said polishing, a thickness of said second metal film is substantially uniform.

11. The method as set forth in claim 1, wherein said polishing comprises polishing with an abrasive alumina or silica pad.

12. The method as set forth in claim 1, wherein said first metal film comprises a Ti layer having a thickness of about 100 Å and a AlCu layer having a thickness of about 8000 Å, and
wherein said second metal film comprises a Ti layer having a thickness of about 100 Å and a AlCu layer having a thickness of about 5000 Å.

13. The method as set forth in claim 1, wherein said wiring has a substantially flat top surface.

14. The method as set forth in claim 1, further comprising forming an intermediate layer between said substrate and said insulating film.

15. The method as set forth in claim 1, wherein after said second metal film is formed, a combined thickness of said first metal film and said second metal film in said trench is greater than a thickness of combined thickness on another part of said semiconductor device, thereby preventing said polishing from causing a dishing effect in said trench.

16. A method of forming damascene wiring in a semiconductor device, said method comprising
providing a substrate on which an insulating film is formed;
forming at least one trench in said insulating film, said at least one trench comprising at least one small trench having a width which is smaller than 1 micrometer and at least one large trench having a width which is equal to or larger than 1 micrometer;
depositing a metal on said insulating film and in said large trench and said small trench;
selectively removing said metal to expose a surface of said insulating film and form a first metal film having a first lower portion which fills said large trench, a second lower portion which fills said small trench and an upper portion projecting at least partially out of said large trench, said upper portion having sidewalls which are substantially coplanar with sidewalls of said large trench and said second lower portion having a surface coplanar with a surface of said insulating film; and
polishing a surface of said semiconductor device in an area around said large trench using a CMP method.

17. The method as set forth in claim 16, wherein said first metal film comprises an alloy including at least one metal selected from a group consisting of tungsten, aluminum, copper and titanium.

18. The method as set forth in claim 16, wherein said selectively removing said metal comprises selectively etching said metal.

19. The method as set forth in claim 16, wherein said forming a first metal film comprises:
forming a resist film on said metal; and
patterning said resist film to form a patterned resist film which covers said metal in said large trench,
wherein said first metal film comprises a portion of metal remaining in said trench.

20. The method as set forth in claim 19, wherein after said selectively removing said metal, a top surface of said insulating film in an area in which a trench is not formed is exposed, and a buried metal film portion comprising a portion of said metal film in said large trench and portion of said metal film in said small trench are left, and
wherein a top surface of said buried metal film portion has a height approximately corresponding to that of the top surface of said insulating film.

21. The method as set forth in claim 19, wherein said first metal film is formed by a reflow sputtering method.

22. The method as set forth in claim 19, wherein said first metal film is formed by a chemical vapor deposition (CVD) method.

23. The method as set forth in claim 19, wherein said first metal film is formed by a plating method.

24. The method as set forth in claim 16, wherein said insulating film comprises a higher level and a lower level,
wherein said large trench is formed on said higher level and said small trench is formed on said lower level, and
wherein said polishing a surface of said semiconductor device comprises polishing a portion of said first metal film formed in said higher level of said insulating film.

25. The method as set forth in claim 24, wherein said polishing comprises polishing a portion of said first metal film formed in said higher level said insulating film using a hard pad.

26. The method as set forth in claim 24, wherein said higher level comprises a memory portion and said lower level comprises a peripheral portion of said semiconductor device.

27. The method as set forth in claim 24, wherein said polishing comprises a polishing load equal to or less than 5.0 psi so that said insulating film and first metal film at said lower level are not polished.

* * * * *